(12) United States Patent
Blaum et al.

(10) Patent No.: US 7,071,851 B1
(45) Date of Patent: Jul. 4, 2006

(54) TECHNIQUES FOR IMPLEMENTING NON-UNIFORM CONSTRAINTS IN MODULATION ENCODED DATA

(75) Inventors: Mario Blaum, San Jose, CA (US); Roy D. Cideciyan, Ruschlikon (CH); Evangelos S. Eleftheriou, Zurich (CH); Richard Leo Galbraith, Rochester, MN (US); Ksenija Lakovic, San Jose, CA (US); Thomas Mittelholzer, Zurich (CH); Travis Oenning, Rochester, MN (US); Bruce A. Wilson, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 11/048,597

(22) Filed: Jan. 31, 2005

(51) Int. Cl.
*H03M 7/00* (2006.01)

(52) U.S. Cl. .............................. 341/59; 341/80; 360/40; 369/59.23

(58) Field of Classification Search .................. 341/58, 341/59, 80; 360/40; 369/59.23
See application file for complete search history.

(56) References Cited

U.S. PATENT DOCUMENTS

| | | | |
|---|---|---|---|
| 4,707,681 A | 11/1987 | Eggenberger et al. | |
| 4,818,969 A | 4/1989 | Krakauer et al. | |
| 5,241,309 A | 8/1993 | Cideciyan et al. | |
| 5,311,521 A | 5/1994 | Fitingof et al. | |
| 5,604,497 A * | 2/1997 | Sonntag | 341/59 |
| 5,757,294 A | 5/1998 | Fisher et al. | |
| 5,757,822 A | 5/1998 | Fisher et al. | |
| 5,760,718 A | 6/1998 | Schouhamer Immink | |
| 6,018,304 A | 1/2000 | Bessios | |
| 6,052,072 A * | 4/2000 | Tsang et al. | 341/59 |
| 6,072,410 A * | 6/2000 | Kim | 341/81 |
| 6,081,210 A * | 6/2000 | Nikolic et al. | 341/59 |
| 6,236,340 B1 | 5/2001 | Patapoutian et al. | |
| 6,417,788 B1 | 7/2002 | McEwen et al. | |
| 6,476,737 B1 * | 11/2002 | Caroselli et al. | 341/59 |
| 6,557,124 B1 | 4/2003 | Cideciyan et al. | |

OTHER PUBLICATIONS de Souza, et al.; Constrained Systems With Unconstrained Positions; Apr. 2002; IEEE Transactions on Information Theory, vol. 48, No. 4, pp. 866-879.*

Blaum; Combining ECC with Modulation: Performance Comparisons, May 1991, IEEE Transactions on Information Theory, vol. 37, No. 3, pp. 945-949.*

(Continued)

*Primary Examiner*—Howard L. Williams
(74) *Attorney, Agent, or Firm*—Townsend and Townsend and Crew LLP

(57) ABSTRACT

Non-uniform modulation encoding techniques are provided to prevent data from containing bit patterns that are prone to errors during read back. Modulation encoding is performed on a data stream to remove error prone bit patterns. Unconstrained data, such as error check parity, that is inserted into the modulated data stream may contain error prone bit patterns. Stricter modulation constraints are enforced on bits that are next to the unconstrained data, than on the remaining bits. By enforcing stricter modulation constraints on these bits, an entire data bit stream can have a desired modulation constraint.

20 Claims, 6 Drawing Sheets

OTHER PUBLICATIONS

Kobayashi, H.; A Survey of Coding Schemes for Tranmission or Recording of Digital Data; Dec. 1971, IEEE Transactions on Communication Technology, vol. COM-19, No. 6 pp. 1087-1100.*

J.D. Coker et al., "Implementation of PRML in a rigid disk drive", IEEE Transactions on Magnetics, vol. 27, No. 6, Nov. 1991.

Roy D. Cideciyan et al., "A PRML system for digital magnetic recording", IEEE Journal on Selected Areas in Communication, vol. 10, No. 1, Jan. 1992.

E. Eleftheriou et al., "Noise-predictive maximum-likelihood (NPML) detection for the magnetic recording channel", IEEE 1996, no month given.

Jonathan D. Coker et al., "Noise-Predictive Maximum Likelihood (NPML) Detection", IEEE Transactions on Magnetics, vol. 34, No. 1, Jan. 1998.

Jaekyun Moon et al., "Maximum Transition Run Codes for Data Storage Systems", IEEE Transactions on Magnetics, vol. 32, No. 5, Sep. 1996.

Roy D. Cideciyan et al., "Maximum Transition Run Codes for Generalized Partial Response Channels", IEEE Journal of Selected Areas in Communications, vol. 19, No. 4, Apr. 2001.

Kees A. Schouhamer Immink et al., "Codes for Digital Recorders", IEEE Transactions on Information Theory, vol. 44, No. 6, Oct. 1998.

"Circuitry for Performing Error Correction Calculations on Baseband Encoded Data to Eliminate Error Propagation", IBM Technical Disclosure Bulletin, Mar. 1981, Author unknown.

M. Mansuripur, "Enumerative Modulation Coding with Arbitrary Constraits and Post-Modulation Error Correction Coding for Data Storage Systems", SPIE vol. 1499 Optical Data Storage, 1991, no month given.

Adriaan J. van Wijngaarden et al., "Efficient Error Control Schemes for Modulation and Synchronization Codes", IEEE Aug. 1998.

Adriaan J. van Wijngaarden et al., "Maximum Runlength-Limited Codes with Error Control Capabilities", IEEE Journal on Selected Areas in Communications, vol. 19, No. 4, Apr. 2001.

William H. Kautz, "Fibonacci Codes for Synchronization Control", IEEE Transactions on Information Theory, Apr. 1965.

Kees A. Schouhamer Immink, "A Practical Method for Approaching the Channel Capacity of Constrained Channels", IEEE Transactions on Information Theory, vol. 43, No. 5, Sep. 1997.

Thomas M. Cover, "Enumerative Source Encoding", IEEE Transactions on Information Theory, vol. IT-19, No. 1, Jan. 1973.

Jorge Campello de Souza et al., "Constrained Systems with Unconstrained Positions", IEEE Transactions on Information Theory, vol. 48, No. 4, Apr. 2002.

D.T. Tang et al., "Block Codes for a Class of Constrained Noiseless Channels", Information and Control 17, 1970, no month given.

* cited by examiner

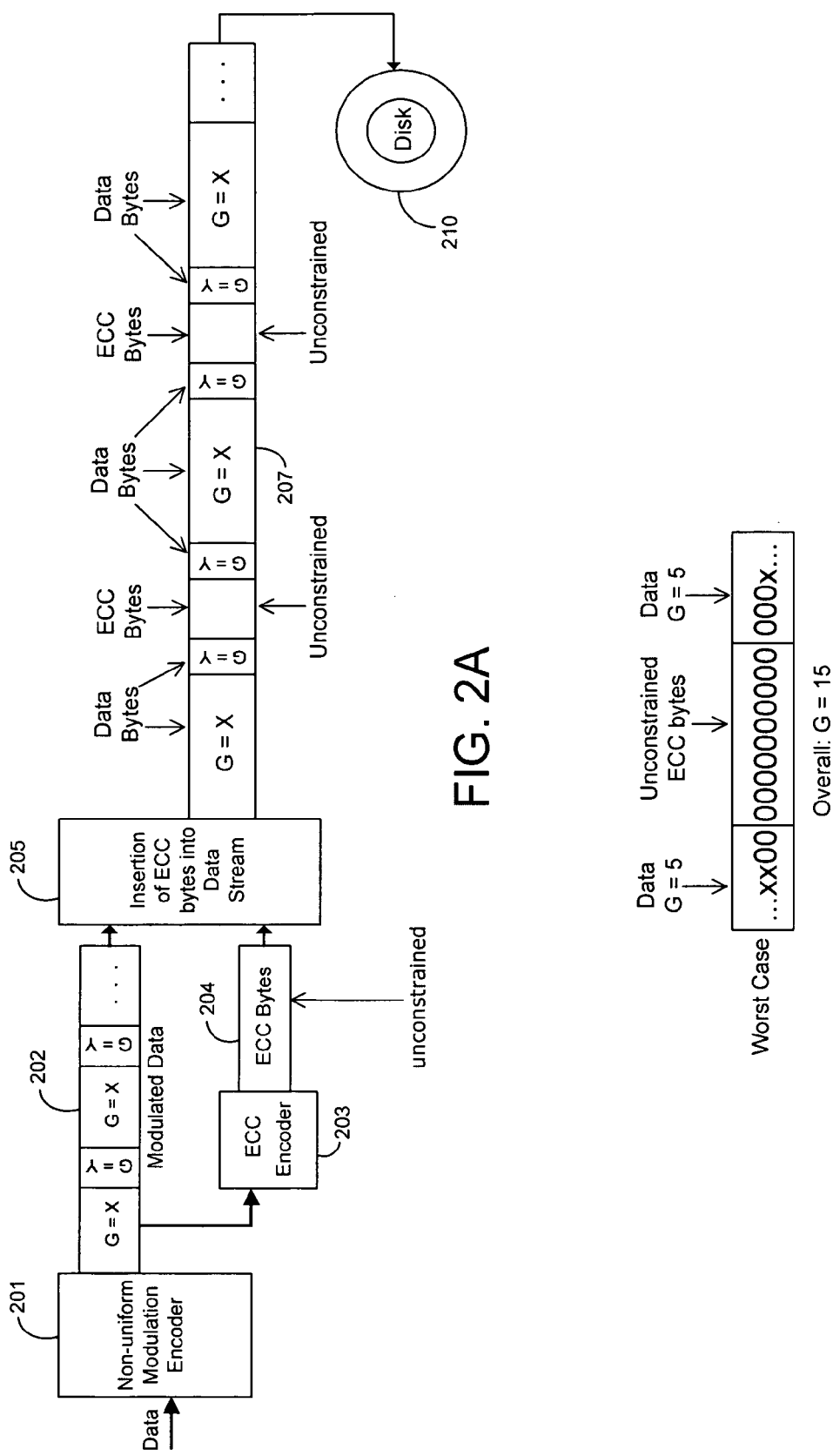

| 0 | 1 | 2 | 3 | 4 | 5 | 6 | 7 | 8 | 9 | 10 | 11 | 12 | 13 | 14 | 15 | 16 | 17 | 18 | 19 | RS |
|---|---|---|---|---|---|---|---|---|---|----|----|----|----|----|----|----|----|----|----|----|
| 6 | 11 | 11 | 11 | 11 | 11 | 11 | 11 | 11 | 10 | 9 | 8 | 7 | 6 | 5 | 5 | 5 | 5 | 5 | 5 | 10 bits |

| 20 | 21 | 22 | 23 | 24 | 25 | 26 | 27 | 28 | 29 | 30 | 31 | 32 | 33 | 34 | 35 | 36 | 37 | 38 | 39 |
|----|----|----|----|----|----|----|----|----|----|----|----|----|----|----|----|----|----|----|----|
| 5 | 5 | 11 | 6 | 11 | 11 | 11 | 11 | 11 | 11 | 11 | 11 | 11 | 11 | 11 | 11 | 11 | 11 | 11 | 10 |

| 40 | 41 | 42 | 43 | 44 | 45 | 46 | 47 | 48 | 49 | RS | 50 | 51 | 52 | 53 | 54 | 55 | 56 | 57 | 58 | 59 |
|----|----|----|----|----|----|----|----|----|----|----|----|----|----|----|----|----|----|----|----|----|
| 9 | 8 | 7 | 6 | 5 | 5 | 5 | 5 | 5 | 5 | 10 bits | 5 | 5 | 11 | 11 | 11 | 11 | 11 | 11 | 11 | 11 |

| 60 | 61 | 62 | 63 | 64 | 65 | 66 | 67 | 68 | 69 | 70 | 71 | 72 | 73 | 74 | 75 | 76 | 77 | 78 | 79 | RS |
|----|----|----|----|----|----|----|----|----|----|----|----|----|----|----|----|----|----|----|----|----|
| 11 | 11 | 11 | 11 | 11 | 11 | 11 | 11 | 11 | 10 | 9 | 8 | 7 | 6 | 5 | 5 | 5 | 5 | 5 | 5 | 10 bits |

| 80 | 81 | 82 | 83 | 84 | 85 | 86 | 87 | 88 | 89 | 90 | 91 | 92 | 93 | 94 | 95 | 96 | 97 | 98 | 99 |
|----|----|----|----|----|----|----|----|----|----|----|----|----|----|----|----|----|----|----|----|
| 5 | 5 | 11 | 11 | 11 | 11 | 11 | 11 | 11 | 10 | 9 | 8 | 7 | 6 | 5 | 5 | 5 | 5 | 2 | 1 |

| | | | | | | | | | |
|---|---|---|---|---|---|---|---|---|---|
| $388 \times 2^{90}$ | $388 \times 2^{89}$ | $388 \times 2^{88}$ | $389 \times 2^{87}$ | $389 \times 2^{86}$ | $389 \times 2^{85}$ | $389 \times 2^{84}$ | $390 \times 2^{83}$ | $390 \times 2^{82}$ | $390 \times 2^{81}$ |
| $390 \times 2^{80}$ | $390 \times 2^{79}$ | $390 \times 2^{78}$ | $390 \times 2^{77}$ | $394 \times 2^{76}$ | $397 \times 2^{75}$ | $401 \times 2^{74}$ | $404 \times 2^{73}$ | $408 \times 2^{72}$ | $411 \times 2^{71}$ |
| $415 \times 2^{70}$ | $422 \times 2^{69}$ | $422 \times 2^{68}$ | $422 \times 2^{67}$ | $422 \times 2^{66}$ | $423 \times 2^{65}$ | $423 \times 2^{64}$ | $423 \times 2^{63}$ | $423 \times 2^{62}$ | $424 \times 2^{61}$ |
| $424 \times 2^{60}$ | $424 \times 2^{59}$ | $424 \times 2^{58}$ | $425 \times 2^{57}$ | $425 \times 2^{56}$ | $425 \times 2^{55}$ | $425 \times 2^{54}$ | $426 \times 2^{53}$ | $426 \times 2^{52}$ | $426 \times 2^{51}$ |
| $426 \times 2^{50}$ | $426 \times 2^{49}$ | $426 \times 2^{48}$ | $426 \times 2^{47}$ | $430 \times 2^{46}$ | $434 \times 2^{45}$ | $438 \times 2^{44}$ | $442 \times 2^{43}$ | $446 \times 2^{42}$ | $450 \times 2^{41}$ |
| $454 \times 2^{40}$ | $462 \times 2^{39}$ | $462 \times 2^{38}$ | $462 \times 2^{37}$ | $462 \times 2^{36}$ | $463 \times 2^{35}$ | $463 \times 2^{34}$ | $463 \times 2^{33}$ | $463 \times 2^{32}$ | $464 \times 2^{31}$ |
| $464 \times 2^{30}$ | $464 \times 2^{29}$ | $464 \times 2^{28}$ | $465 \times 2^{27}$ | $465 \times 2^{26}$ | $465 \times 2^{25}$ | $465 \times 2^{24}$ | $466 \times 2^{23}$ | $466 \times 2^{22}$ | $466 \times 2^{21}$ |
| $466 \times 2^{20}$ | $466 \times 2^{19}$ | $466 \times 2^{18}$ | $466 \times 2^{17}$ | $470 \times 2^{16}$ | $474 \times 2^{15}$ | $478 \times 2^{14}$ | $482 \times 2^{13}$ | $486 \times 2^{12}$ | $490 \times 2^{11}$ |
| $494 \times 2^{10}$ | $502 \times 2^{9}$ | $502 \times 2^{8}$ | $503 \times 2^{7}$ | $503 \times 2^{6}$ | $503 \times 2^{5}$ | $503 \times 2^{4}$ | $504 \times 2^{3}$ | $504 \times 2^{2}$ | $504 \times 2^{1}$ |
| 504 | 252 | 126 | 63 | 32 | 16 | 8 | 4 | 2 | 1 |

| n | 99 | 98 | 97 | 96 | 95 | 94 | 93 | 92 | 91 | 90 | 89 | 88 | 87 | 86 | 85 | 84 | 83 | 82 | 81 | 80 | RS |
|---|----|----|----|----|----|----|----|----|----|----|----|----|----|----|----|----|----|----|----|----|----|
| $B'_n 2^s$ | 380 | 380 | 381 | 381 | 381 | 382 | 382 | 382 | 383 | 383 | 383 | 383 | 383 | 383 | 387 | 390 | 394 | 397 | 401 | 404 | 5 bits |
| j(n) | 4 | 9 | 8 | 10 | 9 | 8 | 10 | 9 | 8 | 10 | 9 | 8 | 7 | 6 | 5 | 5 | 5 | 5 | 5 | 5 | 5 |

| n | 79 | 78 | 77 | 76 | 75 | 74 | 73 | 72 | 71 | 70 | 69 | 68 | 67 | 66 | 65 | 64 | 63 | 62 | 61 | 60 | RS |
|---|----|----|----|----|----|----|----|----|----|----|----|----|----|----|----|----|----|----|----|----|----|
| $B'_n 2^s$ | 408 | 414 | 415 | 415 | 415 | 416 | 416 | 416 | 417 | 417 | 417 | 417 | 417 | 417 | 421 | 425 | 429 | 433 | 437 | 441 | 5 bits |
| j(n) | 5 | 5 | 8 | 10 | 9 | 8 | 10 | 9 | 8 | 10 | 9 | 8 | 7 | 6 | 5 | 5 | 5 | 5 | 5 | 5 | 5 |

| n | 59 | 58 | 57 | 56 | 55 | 54 | 53 | 52 | 51 | 50 | 49 | 48 | 47 | 46 | 45 | 44 | 43 | 42 | 41 | 40 | Parity |
|---|----|----|----|----|----|----|----|----|----|----|----|----|----|----|----|----|----|----|----|----|--------|
| $B'_n 2^s$ | 445 | 452 | 452 | 453 | 454 | 455 | 455 | 456 | 457 | 458 | 458 | 459 | 459 | 460 | 460 | 460 | 461 | 461 | 461 | 462 | 1 bit |
| j(n) | 5 | 5 | 8 | 7 | 8 | 8 | 8 | 7 | 8 | 8 | 9 | 8 | 9 | 8 | 10 | 9 | 8 | 8 | 9 | 8 | |

| n | 39 | 38 | 37 | 36 | 35 | 34 | 33 | 32 | 31 | 30 | 29 | 28 | 27 | 26 | 25 | 24 | 23 | 22 | 21 | 20 | RS |
|---|----|----|----|----|----|----|----|----|----|----|----|----|----|----|----|----|----|----|----|----|----|
| $B'_n 2^s$ | 462 | 462 | 463 | 463 | 463 | 464 | 464 | 464 | 465 | 465 | 465 | 465 | 465 | 465 | 469 | 473 | 477 | 481 | 485 | 489 | 5 bits |
| j(n) | 10 | 9 | 8 | 10 | 9 | 8 | 10 | 9 | 8 | 10 | 9 | 8 | 7 | 6 | 5 | 5 | 5 | 5 | 5 | 5 | 5 |

| n | 19 | 18 | 17 | 16 | 15 | 14 | 13 | 12 | 11 | 10 | 9 | 8 | 7 | 6 | 5 | 4 | 3 | 2 | 1 | 0 | Parity |
|---|----|----|----|----|----|----|----|----|----|----|----|----|----|----|----|----|----|----|----|----|--------|
| $B'_n 2^s$ | 493 | 501 | 502 | 502 | 502 | 503 | 503 | 503 | 504 | 504 | 504 | 504 | 504 | 504 | 512 | 512 | 512 | 512 | 512 | 512 | 1 bit |
| j(n) | 5 | 5 | 8 | 10 | 9 | 8 | 10 | 9 | 8 | 10 | 9 | 8 | 7 | 6 | 5 | 5 | 4 | 3 | 2 | 1 | |

| n | 99 | 98 | 97 | 96 | 95 | 94 | 93 | 92 | 91 | 90 | 89 | 88 | 87 | 86 | 85 | 84 | 83 | 82 | 81 | 80 | RS |
|---|---|---|---|---|---|---|---|---|---|---|---|---|---|---|---|---|---|---|---|---|---|
| $B'_n 2^s$ | 376 | 377 | 377 | 378 | 378 | 379 | 379 | 380 | 380 | 381 | 381 | 381 | 381 | 381 | 384 | 388 | 391 | 395 | 398 | 402 | 5 bits |
| j(n) | 4 | 8 | 9 | 8 | 9 | 8 | 9 | 8 | 9 | 8 | 9 | 8 | 7 | 6 | 5 | 5 | 5 | 5 | 5 | 5 | 5 |

| n | 79 | 78 | 77 | 76 | 75 | 74 | 73 | 72 | 71 | 70 | 69 | 68 | 67 | 66 | 65 | 64 | 63 | 62 | 61 | 60 | RS |
|---|---|---|---|---|---|---|---|---|---|---|---|---|---|---|---|---|---|---|---|---|---|
| $B'_n 2^s$ | 405 | 412 | 412 | 413 | 413 | 414 | 414 | 415 | 415 | 416 | 416 | 416 | 416 | 416 | 419 | 423 | 427 | 431 | 435 | 439 | 5 bits |
| j(n) | 5 | 5 | 9 | 8 | 9 | 8 | 9 | 8 | 9 | 8 | 9 | 8 | 7 | 6 | 5 | 5 | 5 | 5 | 5 | 5 | 5 |

| n | 59 | 58 | 57 | 56 | 55 | 54 | 53 | 52 | 51 | 50 | 49 | 48 | 47 | 46 | 45 | 44 | 43 | 42 | 41 | 40 |
|---|---|---|---|---|---|---|---|---|---|---|---|---|---|---|---|---|---|---|---|---|
| $B'_n 2^s$ | 443 | 450 | 450 | 451 | 451 | 452 | 452 | 453 | 453 | 454 | 454 | 455 | 455 | 456 | 456 | 457 | 457 | 458 | 458 | 459 |
| j(n) | 5 | 5 | 9 | 8 | 9 | 8 | 9 | 8 | 9 | 8 | 9 | 8 | 9 | 8 | 9 | 8 | 9 | 8 | 9 | 8 |

| n | 39 | 38 | 37 | 36 | 35 | 34 | 33 | 32 | 31 | 30 | 29 | 28 | 27 | 26 | 25 | 24 | 23 | 22 | 21 | 20 | RS |
|---|---|---|---|---|---|---|---|---|---|---|---|---|---|---|---|---|---|---|---|---|---|
| $B'_n 2^s$ | 459 | 460 | 460 | 461 | 461 | 462 | 462 | 463 | 463 | 464 | 464 | 464 | 464 | 464 | 468 | 472 | 476 | 480 | 484 | 488 | 5 bits |
| j(n) | 9 | 8 | 9 | 8 | 9 | 8 | 9 | 8 | 9 | 8 | 9 | 8 | 7 | 6 | 5 | 5 | 5 | 5 | 5 | 5 | 5 |

| n | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|
| $B'_n 2^s$ | 492 | 500 | 500 | 501 | 501 | 502 | 502 | 503 | 503 | 504 | 504 | 504 | 504 | 504 | 512 | 512 | 512 | 512 | 512 | 512 |
| j(n) | 5 | 5 | 9 | 8 | 9 | 8 | 9 | 8 | 9 | 8 | 9 | 8 | 7 | 6 | 5 | 5 | 4 | 3 | 2 | 1 |

FIG. 7

TECHNIQUES FOR IMPLEMENTING NON-UNIFORM CONSTRAINTS IN MODULATION ENCODED DATA

BACKGROUND OF THE INVENTION

The present invention relates to techniques for implementing non-uniform constraints in modulation encoded data, and more particularly, to techniques for providing stronger constraints for modulation encoded data located next to unconstrained information.

A disk drive can write data bits onto a data storage disk such as a magnetic hard disk. The disk drive can also read data bits that have been stored on a data disk. Certain sequences of data bits are difficult to write onto a disk and often cause errors during read-back of the data.

Long recorded data sequences of the same polarity are examples of data bit patterns that are prone to errors. These data sequences correspond to long sequences of binary zeros or binary ones in the NRZ (non return-to-zero) representation, or alternatively to long sequences of binary zeros in the NRZI or PR4 representations. Another example of error prone data bit patterns are long sequences of zeros in alternating positions (e.g., 0a0b0c0d0 . . . , where a, b, c, d may each be 0 or 1) in the PR4 representation.

Binary sequences are routinely transformed from one representation to another using precoders and inverse precoders, according to well known techniques. In describing this invention we will represent all binary sequences as PR4 sequences unless otherwise stated. A PR4 representation can be transformed into an NRZI representation by a precoder which convolves with 1/1+D or into an NRZ representation by a precoder which convolves with $1/(1+D^2)$.

It is desirable to eliminate error prone bit sequences in user input data. Eliminating error prone bit sequences ensures reliable operation of the detector and timing loops in a disk drive system. One way to eliminate error prone bit sequences is to substitute the error prone bit sequences with non-error prone bit patterns that are stored in memory in lookup tables. Lookup tables, however, are undesirable for performing substitutions of very long bit sequences, because they require a large amount of memory.

Many disk drives have a modulation encoder. A modulation encoder uses modulation codes to eliminate sequences of bits that are prone to errors.

Maximum transition run (MTR) constrained codes are one specific type of modulation code that are used in conjunction with a 1/(1+D) precoder. With respect to MTR codes, a j constraint refers to the maximum number of consecutive ones in an NRZI representation, a k constraint refers to the maximum number of consecutive zeros in an NRZI representation, and a t constraint refers to the maximum number of consecutive pairs of bits of the same value in an NRZI representation (e.g., aabbccddee . . . ).

Codes that constrain the longest run of zero digits in the PR4 representation of a sequence are said to enforce a G-constraint where G is the longest allowed run of consecutive zeros. A G constrained PR4 representation is mapped to a k-constrained NRZI representation by a 1/(1+D) precoder, where k=G+1.

Codes that constrain the longest run of zero digits in alternate locations in the PR4 representation of a sequence are said to enforce an I-constraint where I is the longest run of zeros in consecutive odd or even locations. An I-constrained sequence is necessarily G-constrained with G=2I.

An I constrained PR4 representation is mapped to a t-constrained NRZI representation by a 1/(1+D) precoder, where t=I.

Fibonacci codes are one example of modulation codes that are used by modulation encoders. Fibonacci codes provide an efficient way to impose modulation code constraints on recorded data to eliminate error prone bit sequences. A Fibonacci encoder maps an input number to an equivalent number representation in a Fibonacci base. A Fibonacci encoder maps an input vector with K bits to an output vector with N bits. A Fibonacci encoder uses a base with N vectors, which is stored as an N×K binary matrix. Successive application of Euclid's algorithm to the input vector with respect to the stored base gives an encoded vector of length N.

Disk drives typically have error correction encoders. A Reed-Solomon (RS) encoder is one type of error correction encoder. An RS encoder generates error correction code (ECC) check bytes while a cyclic code generates cyclic redundancy check (CRC) bits or bytes. The CRC encoder inserts CRC check bits or bytes, while the RS encoder inserts ECC check bytes into the data stream before data is written onto a disk. After data is read from the disk, the ECC check bytes are used to correct errors in the data bytes using well known decoding processes. The CRC check bytes are used to validate the corrected data bytes using well known processes.

Modulation encoding can be performed prior to RS encoding or after RS encoding. Performing modulation encoding after RS encoding is referred to as forward concatenation. In forward concatenation, data is initially RS encoded. Then the data, CRC and RS parity are modulation encoded, and the modulation encoded data is written onto a disk. Data is subsequently read from the disk and demodulated. RS decoding is performed after the data is demodulated.

Codewords of an efficient modulation code containing a single bit in error are frequently decoded to data sequences containing many bits in errors. This undesirable property of the modulation decoder is called error propagation. Error propagation decreases the effectiveness of the RS code, because a relatively small number of bit errors present when the data is read from the disk may be multiplied by error propagation into many bits in error at the input to the RS decoder. These errors may overwhelm the correcting capability of the RS code.

Performing modulation encoding prior to RS encoding is referred to as reverse concatenation. Reverse concatenation solves the problem of error propagation, because the RS decoder corrects any errors in the encoded data before that data is demodulated. In most reverse concatenated systems, the RS parity symbols must still be demodulated before the RS code can be decoded. This means that while the effect of error propagation is reduced it is not entirely eliminated.

In some reverse concatenation systems, the RS check bytes are not constrained by modulation encoding in order to keep both overhead and complexity low, and the check bytes are inserted into the data stream after modulation encoding. The benefit of this approach is that the RS parity check symbols are neither encoded nor decoded, and thus error propagation by the modulation decoder is entirely avoided.

FIG. 1A illustrates a reverse concatenation technique of this type. Data is initially encoded by a modulation encoder 101. Modulation encoder 101 generates data 102 that is modulated according to a predetermined constraint. For example, a global constraint may be that modulated data 102 can have no more than 10 consecutive zeros (G=10). The modulated data is then encoded by an RS encoder 103 to generate RS check bytes 104. RS check bytes 104 are unconstrained. For example, check bytes 104 may contain more than 10 consecutive zeros.

Multiplexer 105 inserts the check bytes into the modulated data stream. The combined data stream 107 is then stored on disk 110.

The disadvantage of this approach is that RS parity check symbols when inserted in the data bytes, may create error prone sequences of bits, such as too many consecutive zeros. The insertion of unconstrained check bytes significantly degrades the overall modulation constraint of a modulated data stream.

FIG. 1B illustrates an example of a worst case scenario for the reverse concatenation technique shown in FIG. 1A. For example, assume that the modulation data 102 has a constraint of G=10, and the RS check bytes are 10 bits long. Although only a maximum of 10 consecutive zeros are allowed in the modulated data 102, the combined data stream 107 may violate this constraint with a maximum of 20 consecutive zeros (G=20), as shown in FIG. 1B.

Therefore, it would be desirable to provide techniques for preventing error detection and correction codes from containing error prone bit sequences in reverse concatenation schemes in which the ECC parity data is not encoded.

BRIEF SUMMARY OF THE INVENTION

The present invention provides techniques for implementing non-uniform constraints on data that is modulation encoded in order to achieve uniform constraints on the overall stream containing encoded and unconstrained data. In some reverse concatenation architectures unconstrained error control code parity is inserted into the data stream after modulation encoding. The present invention prevents these parity bits which are not modulation encoded from degrading the overall modulation constraint of the resulting data stream.

Specifically the present invention prevents a situation in which a data stream that consists of both modulation encoded data and unconstrained data contains bit sequences that tend to cause errors during read back, such as too many consecutive zeros. Stricter modulation constraints are enforced on modulation encoded data bits that are next to the unconstrained data bits, relative to the remaining modulation encoded data bits. By enforcing stricter modulation constraints on the bits that are next to the unconstrained bits, an entire stream of data can be confined to a desired modulation constraint.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 2A illustrates a modulation encoder that imposes non-uniform constraints on data in a reverse concatenation scheme according to an embodiment of the present invention.

FIG. 2B illustrates an example of a codeword with non-uniform modulation constraints according to an embodiment of the present invention.

FIG. 3 illustrates another example of non-uniform constraints that are implemented on a codeword according to an embodiment of the present invention.

FIG. 4 illustrates some of the elements of a base of 100 vectors that give the non-uniform constraints of FIG. 3.

FIG. 5 illustrates the 100 vectors of the base of FIG. 4 in decimal form.

FIGS. 6–7 illustrate two additional embodiments of codes that provide non-uniform modulation constraints, according to the present invention.

DETAILED DESCRIPTION OF THE INVENTION

Figure 1A:
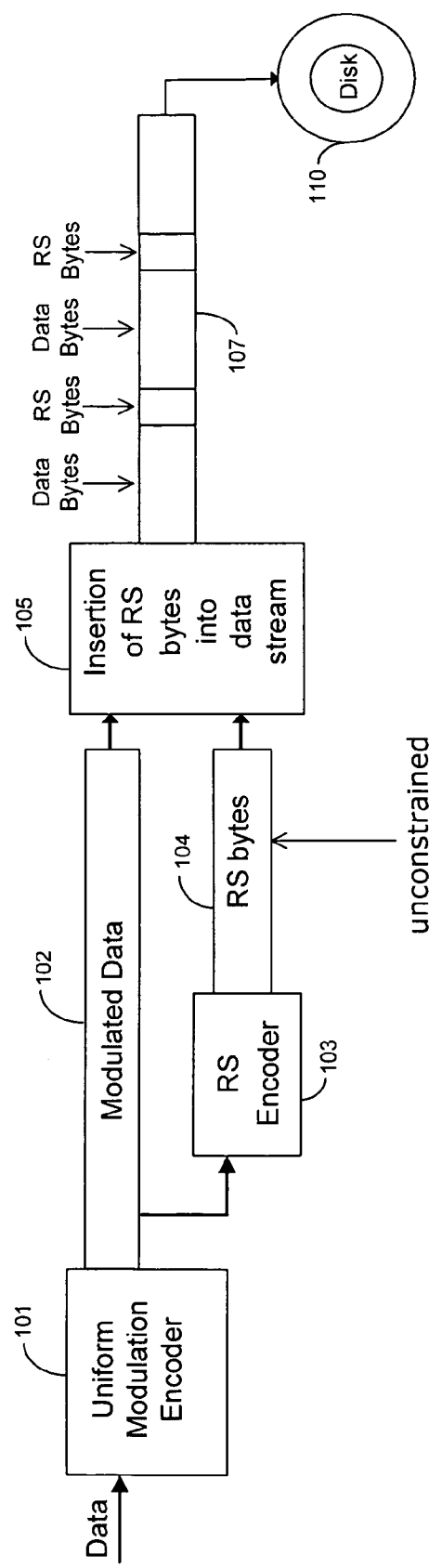
FIG. 1A illustrates a prior art reverse concatenation technique.
Figure 1B:
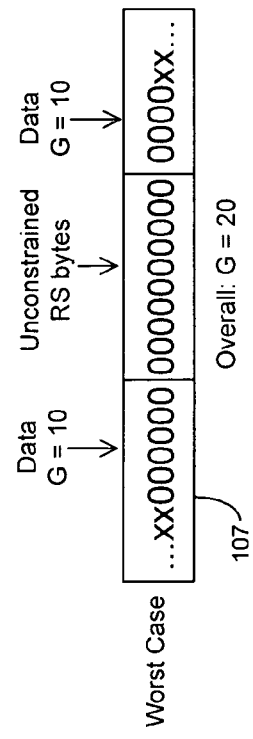
FIG. 1B illustrates an example of a worst case scenario for the reverse concatenation technique shown in FIG. 1A.

FIG. 2A illustrates a first embodiment of the present invention. Input data is initially encoded by a non-uniform modulation encoder 201 to generate a stream 202 of modulated data. Non-uniform modulation encoder 201 can be, for example, a Fibonacci encoder or another type of encoder that imposes a limit on at least one type of bit sequence. For example, modulation encoder 201 can impose a limit on the number of consecutive zeros in the modulated data output stream 202.

Non-uniform modulation encoder 201 imposes varying constrains on the data stream 202. A first constraint (G=X) is imposed on a first predetermined number of codeword locations. A second constraint (G=Y) is imposed on a second predetermined number of codeword locations. The second constraint is more stringent than the first constraint (i.e., Y<X). Modulation encoder 201 can also impose a third constraint, a fourth constraint, a fifth constraint, etc. on the modulated data 202.

The stricter code constraint must be applied over a span of locations, surrounding the location at which the unconstrained data will be inserted, sufficient to ensure that the desired constraints are met after unconstrained data is inserted.

For example, if a global constraint G=14 is desired after the insertion of ten unconstrained bits between bits 10 and 11 of the constrained sequence, then a modulation code constraint must be enforced that prohibits runs of more than 4 consecutive zeros starting in any of the following locations {7, 8, 9, 10, 11}.

It should be understood the techniques of the present invention apply to any type of modulation codes and any type of modulation constraints. For example, the techniques of the present invention can generate non-uniform global and/or interleaved constraints. The techniques of the present invention can also generate non-uniform constraints for MTR codes including non-uniform j constraints, non-uniform k constraints, and non-uniform t constraints.

The modulated data 202 is encoded by an error correction encoder 203 using a well known error correction encoding algorithm, such as Reed-Solomon encoding. ECC encoder 203 generates ECC check bytes 204. ECC check bytes 204 are generated after modulation encoding (which is performed by block 201) and left unconstrained. In the embodiment of FIG. 2A, the ECC check bytes are not constrained by modulation encoding in order to keep both overhead and complexity low, and the check bytes are inserted into the data stream after modulation encoding.

Multiplexer 205 inserts the unconstrained check bytes into the modulated data stream to generate a combined data stream 207. Multiplexer 205 inserts each unconstrained ECC check byte between the bytes that have the stricter constraint (G=Y), as shown in data stream 207. Each unconstrained ECC check byte is surrounded on both sides by the data bytes that have the stricter constraint (G=Y).

An example of an output data stream 207 is shown in FIG. 2B and described to illustrate the above concepts. This example is not intended to limit the scope of the present invention in any way. One of skill in the art will understand that many other embodiments are within the scope of the present invention.

Encoder 201 can constrain 5 data bytes so that no more than 10 consecutive zeros are allowed in these 5 bytes (G=X=10). The next 2 data bytes that are received are constrained so that no more than 5 consecutive zeros are allowed in these 2 bytes (G=Y=5). ECC encoder 203 generates 10 bit long ECC check bytes. Multiplexer 205 inserts the check bytes into data stream 202 in between the two data bytes that are more strictly constrained by G=5. In this example, the modulation code constraints are varied from byte-to-byte but remain constant within a byte. In general modulation code constraints vary from bit-to-bit irrespective of byte boundaries.

A portion of the resulting data is shown in FIG. 2B. The ECC bytes contain a maximum of 10 consecutive zeros, because they are unconstrained. The data bytes on either side of the ECC bytes are limited to having a maximum of 5 consecutive zeros (G=5). In the worst case scenario illustrated in FIG. 2B, the ECC check byte is inserted in between a maximum run of 5 consecutive zeros in the G=5 data bytes. The total number of consecutive zeros in the combined bit stream is 15. Therefore, the combined bit stream output of multiplexer 205 has an overall constraint of G=15. This constraint represents a very significant improvement over the G=20 constraint imposed by the prior art system of FIG. 1A.

As mentioned above, non-uniform modulation encoder 201 can be a Fibonacci encoder. Fibonacci encoding of data bit streams to eliminate long strings of ones (or zeros) is well known to those of skill in the data encoding art. An important feature of the present invention is a Fibonacci encoder that, contrary to the traditional ones available in literature, generates a sequence with a varying value of the run-length of 1 s (or of 0s, simply by flipping the bits). This feature allows for regions of data bytes to be subject to a constraint G=X, while other regions are subject to a more stringent constraint G=Y, where Y<X, as depicted in FIG. 2A. Sets of the unconstrained data (e.g., an ECC check-byte) will be inserted in the regions where G=Y.

FIG. 3 illustrates a specific example of how non-uniform constraints of the present invention can be implemented at different locations in a 100 bit codeword. This example is not intended to limit the scope of the present invention. One of skill in the art will understand that many other embodiments are within the scope of the present invention.

Two rows 301 and 302 of a table are shown in FIG. 3. Because the two rows each have 103 columns, rows 301 and 302 are broken up into 5 sections to fit onto one drawing sheet. Row 301 enumerates the bits of a 100-bit modulation codeword with a non-uniform G constraint. Three 10-bit long symbols, each corresponding to a RS check-byte, have been inserted into the middle of the codeword.

Row 302 indicates the non-uniform run-length of zeros (i.e., G constraint) corresponding to each of the 100 bits of the codeword as given by a modulation encoder of the present invention. The G constraints shown in row 302 are forward looking in the sense that each constraint indicates the maximum number of zeros (or ones) allowed at that bit location going forward (to the right in FIG. 3). For example, starting at bit 1, there may be at most 11 consecutive zeros. As another example, starting at bit 14, there may be at most 5 consecutive zeros. Thus, the present invention can apply varying constraints at different bit locations in the middle of a codeword.

Bits 8 through 14 have global constraints that vary from 11 to 5 for the following reasons. If six consecutive zeros, starting in bit 14, are disallowed then it is not possible for any allowed sequence starting in bit 13 to contain seven consecutive zeros, because any such sequence would necessarily contain six consecutive zeros in locations 14 through 19. Similarly, runs of eight consecutive zeros starting in bit location 12 are disallowed and so on.

Figures 4, 5:
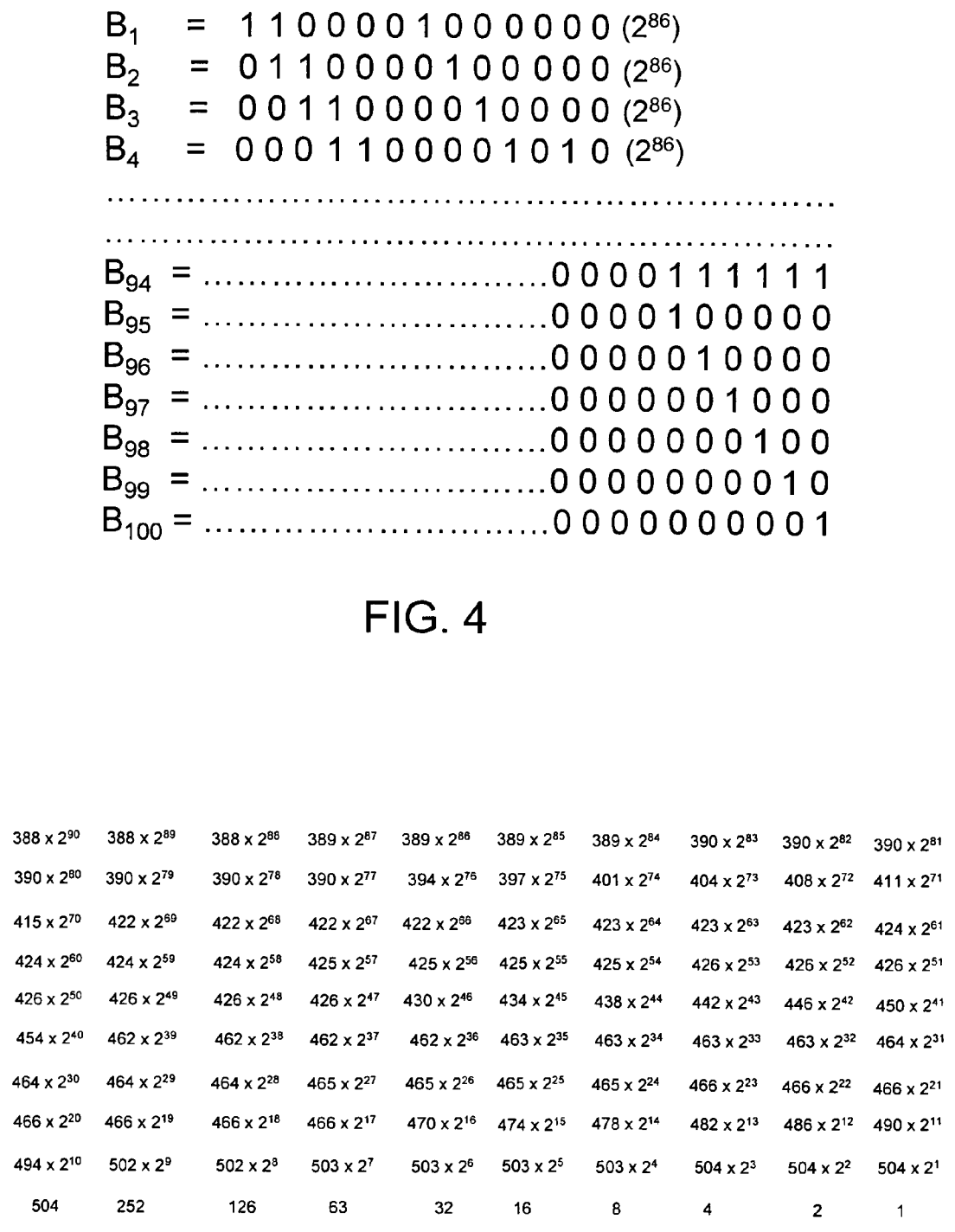

A rate k/n Fibonacci encoder, corresponding rate n/k decoder and associated code constraints are all completely described by an n-element set of k-bit code base vectors. For example, consider the embodiment of the rate 99/100 Fibonacci code shown in FIGS. 3–5. The Fibonacci encoder and decoder attain the non-uniform G constraint of FIG. 3 and they are explicitly described by the set of base vectors shown in FIGS. 4 and 5. This Fibonacci code base includes 100 elements $B_1$–$B_{100}$. Each of these 100 elements has 99 binary bits. A few of these elements are shown in FIG. 4 in binary. All 100 of the Fibonacci code base elements are shown in FIG. 5 in decimal, wherein $B_1=388\times2^{90}$, $B_2=388\times2^{89}$, $B_3=388\times2^{88}$, etc.

Two additional embodiments of codes shown in FIGS. 6–7 are now described. These codes belong to the class of rate-199/200 (G,I)-constrained codes. These codes achieve very tight G- and I-constraints.

The generalized Fibonacci code for the even and odd interleave has length N=100. For the base elements $B_1$–$B_{100}$ the input/output relationship of the Fibonacci encoder for the even or odd interleave is characterized by $u_1 2^{99} + u_2 2^{98} + \ldots + u_{100} = v_1 B_1 + v_2 B_2 + \ldots + v_{100} B_{100}$ where $u_1, u_2, \ldots, u_{100}$ are the bits at the input of the Fibonacci encoder for even or odd interleave and $v_1, V_2, \ldots, v_{100}$ are the bits at the output of the Fibonacci encoder for even or odd interleave. For the description of the FIGS. 6–7 embodiments, the expression $v_1 (B'_{99} 2^9) 2^{90} + v_2 (B'_{98} 2^9) 2^{89} + \ldots + v_{100} (B'_0 2^9) 2^{-9}$ is used to represent the output of the Fibonacci encoder for the even or odd interleave.

A rate-199/200 code, referred to as Code A, is shown in FIG. 6. Code A is based on a rate-9/10 code constrained by a short block encoder, which is described in detail in commonly assigned, co-pending U.S. patent application Ser. No. 11/048273 which is incorporated by reference herein.

Code A was designed using an irregular j-constraint of the Fibonacci codes on each interleave. The bases were chosen such that there are three possible insertion locations for 10-bit RS parity symbols. Code A is obtained by serial concatenation with the rate-9/10 short block constrained code. The resulting Code A is a rate-199/200 (G=20, I=10) code. Code A also supports single parity insertions in each interleave between locations 50 and 49, and at the boundary without weakening of the G- and I-constraints.

Another code, Code B, is shown in FIG. 7. Code B is constructed in a similar manner as Code A. It uses a rate-13/14 code constrained by a short block encoder in the even and odd interleave, as described in detail in commonly assigned, co-pending U.S. patent application Ser. No. 11/048273, filed herewith.

The generalized Fibonacci code is determined by the bases given in FIG. 7. This generalized Fibonacci code has a better j-profile than the one of Code A. The resulting Code B is a rate-199/200 (G=20, I=10) code with three locations for 10-bit RS parity symbol insertion that do not weaken the G- and I-constraints. Owing to the improved j-profile of the generalized Fibonacci code, Code B supports more locations for inner parity insertion than Code A, while maintaining the same (G, I)-constraints.

In the embodiments of FIGS. 6 and 7, the RS symbols are divided into half bytes of 5-bits. Each half byte is separately inserted into more strongly constrained portions of the codewords. In FIG. 6, single bit parity information is inserted into the codeword separately from the half bytes.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A disk drive system comprising:
   a modulation encoder that imposes non-uniform modulation constraints on data to generate a constrained codeword; and
   a multiplexer that inserts blocks of unconstrained data into more strongly constrained portions of the constrained codeword before the constrained codeword is stored on a disk.

2. The disk drive system defined in claim 1 wherein the modulation encoder generates the constrained codeword having a first constraint on sequences starting in a first set of bit locations, a second constraint on sequences starting in a second set of bit locations, and a third constraint on sequences starting in a third set of bit locations.

3. The disk drive system defined in claim 2 wherein the modulation encoder generates the constrained codeword having a fourth constraint on sequences starting in a fourth set of bit locations.

4. The disk driver system defined in claim 3 wherein the modulation encoder generates the constrained codeword having a fifth constraint on sequences starting in a fifth set of bit locations.

5. The disk drive system defined in claim 1 wherein the modulation encoder encodes the data using Fibonacci codes.

6. The disk drive system according to claim 1 further comprising:
   an error correction encoder that generates unconstrained parity information based on the constrained codeword,
   wherein the multiplexer inserts the unconstrained parity information into the constrained codeword before the constrained codeword is stored on the disk.

7. The disk drive system according to claim 6 wherein the error correction encoder is a Reed-Solomon encoder that generates error correction check bytes.

8. The disk drive system according to claim 6 wherein the multiplexer inserts 10-bit parity bytes into the more strongly constrained portions of the constrained codeword.

9. The disk drive system according to claim 6 wherein the multiplexer inserts 5-bit parity bytes into the more strongly constrained portions of the constrained codeword.

10. A disk drive controller chipset comprising:
    a modulation encoder that imposes a first constraint on a codeword starting at a first bit location and that imposes a second constraint on the codeword starting at a second bit location to generate an output codeword, wherein the second constraint is more strict than the first constraint; and
    a multiplexer that inserts a block of unconstrained data into a portion of the output codeword that is constrained according to the second constraint before the output codeword is stored on a disk.

11. The disk drive controller chipset according to claim 10 wherein the multiplexer inserts the block of unconstrained data into a middle portion of the output codeword.

12. The disk drive controller chipset according to claim 10 wherein the modulation encoder encodes the codeword using Fibonacci codes.

13. The disk drive controller chipset according to claim 10 further comprising:
    an error correction encoder that generates unconstrained parity information based on the output codeword,
    wherein the multiplexer inserts the unconstrained parity information into the output codeword before the output codeword is stored on the disk.

14. The disk drive controller chipset according to claim 13 wherein the error correction encoder is a Reed-Solomon encoder that generates error correction check bytes.

15. The disk drive controller chipset according to claim 10 wherein the modulation encoder imposes a third constraint on the codeword starting at a third bit location, and the third constraint is more strict than the first constraint.

16. A method for imposing modulation constraints on data, the method comprising:
    imposing non-uniform modulation constraints on a codeword to generate a constrained codeword; and
    inserting unconstrained data into a more strongly constrained portion of the constrained codeword before the constrained codeword is stored on a medium.

17. The method defined in claim 16 further comprising:
    generating unconstrained parity information based on the constrained codeword using an error correction encoder,
    wherein the unconstrained parity information is inserted into the more strongly constrained portion of the constrained codeword.

18. The method defined in claim 16 wherein imposing the non-uniform modulation constraints on the codeword further comprises imposing non-uniform modulation constraints on the codeword using Fibonacci codes.

19. The method defined in claim 16 wherein imposing the non-uniform modulation constraints on the codeword further comprises:
    imposing a first constraint on a first portion of the codeword;
    imposing a second constraint on a second portion of the codeword, wherein the second constraint is more strict than the first constraint; and
    imposing a third first constraint on a third portion of the codeword, wherein the third constraint is more strict than the first constraint.

20. The method defined in claim 19 wherein imposing the non-uniform modulation constraints on the codeword further comprises:
    imposing a fourth constraint on a fourth portion of the codeword, wherein the fourth constraint is more strict than the third constraint, and
    wherein inserting the unconstrained data into the more strongly constrained portion of the constrained codeword further comprises inserting the unconstrained data into the fourth portion of the codeword.

* * * * *